United States Patent [19]
Blondeau et al.

[11] Patent Number: 5,262,656
[45] Date of Patent: Nov. 16, 1993

[54] OPTICAL SEMICONDUCTOR TRANSCEIVER WITH CHEMICALLY RESISTANT LAYERS

[75] Inventors: Robert Blondeau, Ablis; Daniel Rondi, Orsay; Jean-Charles Renaud, Vitry Sur Seine, all of France

[73] Assignee: Thomson-CSF, Puteaux, France

[21] Appl. No.: 893,020

[22] Filed: Jun. 3, 1992

[30] Foreign Application Priority Data

Jun. 7, 1991 [FR] France ................. 91 06933

[51] Int. Cl.$^5$ ............................................. H01L 27/14
[52] U.S. Cl. ............................ 257/80; 257/82; 257/84; 257/85; 257/98; 372/50; 385/14
[58] Field of Search ............. 257/84, 85, 98, 80, 257/82; 372/50; 385/10, 14, 130, 131, 132

[56] References Cited

U.S. PATENT DOCUMENTS

| | | | |
|---|---|---|---|
| 4,901,321 | 2/1990 | Blondeau et al. | 372/7 |
| 5,031,188 | 7/1991 | Koch et al. | 372/50 |
| 5,033,816 | 7/1991 | Blondeau et al. | 350/162.22 |

FOREIGN PATENT DOCUMENTS

| | | |
|---|---|---|
| 0187198 | 7/1986 | European Pat. Off. |
| 0240400 | 10/1987 | European Pat. Off. |
| 0422854 | 4/1991 | European Pat. Off. |
| 0434528 | 6/1991 | European Pat. Off. |
| 0060788 | 1/1985 | Japan ............... 372/50 |
| 60-182779 | 9/1985 | Japan ............... 257/84 |

OTHER PUBLICATIONS

Liou et al., "Monolithic Integrated in GaAsP/InP Distributed Feedback Laser with Y-Branching Waveguide and a Monitoring Photodetector Grown by Metal Organic Chemical Vapor Deposition," *Appl. Phys. Lett.*, 54(2), Jan. 9, 1989, pp. 114–116.

Glastre et al., "Polarisation Insensitive 1.55 μm Semiconductor Integrated Optical Amplifier with Access Waveguides Grown by LP-MOCVD," *Electronics Letters* vol. 27, No. 11, May 23, 1991, pp. 899–900.

*Primary Examiner*—William Mintel
*Attorney, Agent, or Firm*—Oblon, Spivak, McClelland, Maier & Neustadt

[57] ABSTRACT

An opto-electronic device which monolithically integrates a laser emitter and an optical detector positioned in-line on a single waveguide, in which the laser emitter and detector operate at different wavelengths. Such an opto-electronic device may find particular application in various transmission or telecommunication systems.

7 Claims, 5 Drawing Sheets

OPTICAL SEMICONDUCTOR TRANSCEIVER WITH CHEMICALLY RESISTANT LAYERS

BACKGROUND OF THE INVENTION

The invention concerns an optical semiconductor transceiver and more particularly a light emitter and receiver integrated on the same substrate and connected to the same optical waveguide.

To be more precise, the invention concerns an optoelectronic device monolithically integrating a Perot-Fabry semiconductor laser or a distributed network reflector (distributed feedback DFB) and a photodetector, each operating at a particular wavelength and both positioned in-line on the same waveguide. Emission and detection can be performed simultaneously with the possibility of having the detector operating alternately with the laser emission.

Owing to the advantages of optical transmission, (capacity, space requirement, immunity to interference, etc.), subscriber connection to networks, such as video broadcasting networks or integrated services digital networks (ISDN), by means of fiber optics is becoming increasingly attractive. Moreover, bi-directional transmission on the same fiber should make it possible to reduce line costs.

However, this requires terminal equipment such as transceivers of low cost, which calls for new structures monolithically integrating the two functions of emission and reception with simultaneous input and output on the same fiber.

Different technical solutions are known, implemented either by monolithic integration or by hybridization of the two functions of emission and reception.

Thus, the B. HILLERICH et al document "Transceiver module for single mode fiber subscriber link", IOOC'89, Kobé, vol. 2, page 76-77 describes a dual wavelength duplexer for bi-directional links made using hybrid technology.

The K. YAMAGUHI et al document EOOC' 87, pages 275-278 describes a duplexer connecting a luminescent diode and a photodetector using hybrid technology.

The V. KOREN et al document, IOOC'89, KOBE, vol. 2, page 8-9 describes a three DFB laser configuration with separately adjustable wavelengths connected by means of a mixer in an optical output amplifier, the whole assembly being monolithically integrated.

Bi-directional optical links and in particular transceiver light emitting diode type components are described in French patents numbers 2 273371, 2 406896, 2 426295, 2 493047. However, these types of components perform the emission and detection functions alternately and not simultaneously.

As regards the monolithic integration of several functions, different devices have been manufactured.

For example, the integration of a distributed feedback (DFB) laser and a low loss waveguide is described in French patent No. 2 596 529 and in the JC. RENAUD, R. RONDI, Y. BOURBIN, A. TALNEAU, G. GLASTRE, G. VILAIN, A. ENARD, R. BLONDEAU document, "Monolithic integration of a 1.55 μm DFB laser and a waveguide by MOCDV epitaxies" 3rd Microelectronic and Opto-electronic National Days III-V, March 1990, in addition to the integration of a demultiplexer and its access waveguides described in Interim Report ESPRIT 263, Period 09, Section A "Monolithic integration of a multi/demultiplexer and its access waveguides" or the integration of an optical amplifier and its passive guides described in French patent application No. 89 17087.

Finally, the T. L. KOCH et al document, "Simple In-Line Bi-Directional 1.5 μm/1.3 μm Transceivers'-'—12th IEEE International Semiconductor laser conference, Sep. 9-14, 1990 DAVOS Switzerland, describes a semiconductor laser and detector aligned and produced on the same substrate.

SUMMARY OF THE INVENTION

The structures described, however, are difficult to fabricate and the present invention concerns a structure which makes it possible to resolve these difficulties.

The invention concerns an optical semiconductor transceiver comprising a detector and a laser connected to the same waveguide, wherein this waveguide includes a guiding layer covered by a chemically resistant layer on which is provided a guiding element.

The invention also concerns a process for the manufacture of a semiconductor transceiver characterized by the fact that it includes the following stages:
  epitaxy on one surface of a substrate:
    of a first optical guidance layer,
    of a first chemically resistant layer,
    of a second optical guidance layer,
    of layers of materials required for the production of, on the one hand, a laser and, on the other hand, a photodetector,
  etching of the laser and the photodetector down to the second optical guidance layer;
  etching in the second optical guidance layer of a guiding element down to the first chemically resistant layer;
  epitaxy of a layer of containment material; forming of p-n junctions in the layer of containment material.

BRIEF DESCRIPTION OF THE DRAWINGS

The different purposes and characteristics of the invention will become clearer on reading the following description, given as an example, with reference to the figures.

DESCRIPTION OF THE PREFERRED EMBODIMENT

Figure 1:
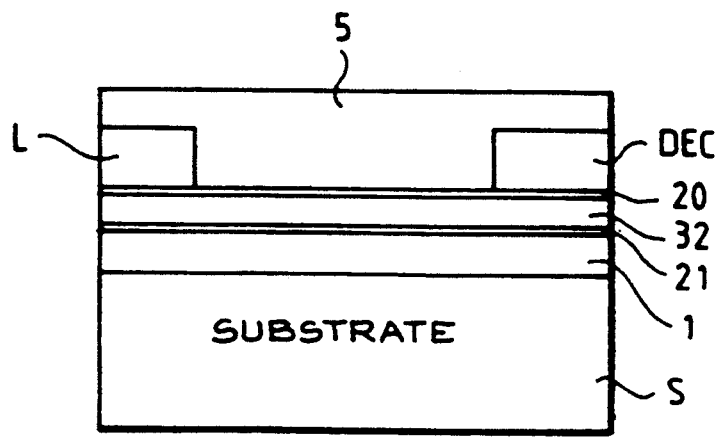
FIGS. 1 and 2 are a general example of the embodiment according to the invention.

First, with reference to FIGS. 1 and 2, a simplified embodiment of the device according to the invention will be described.

This device comprises, on a substrate S, a guiding layer 1 covered by a chemically resistant layer 21 on which is provided a guiding element 32. The detector DEC and the laser L are both located on the guiding element 32.

Another chemically resistant layer can also be provided on the guiding element 32. The assembly is covered by a layer of containment material 5.

Figure 2:
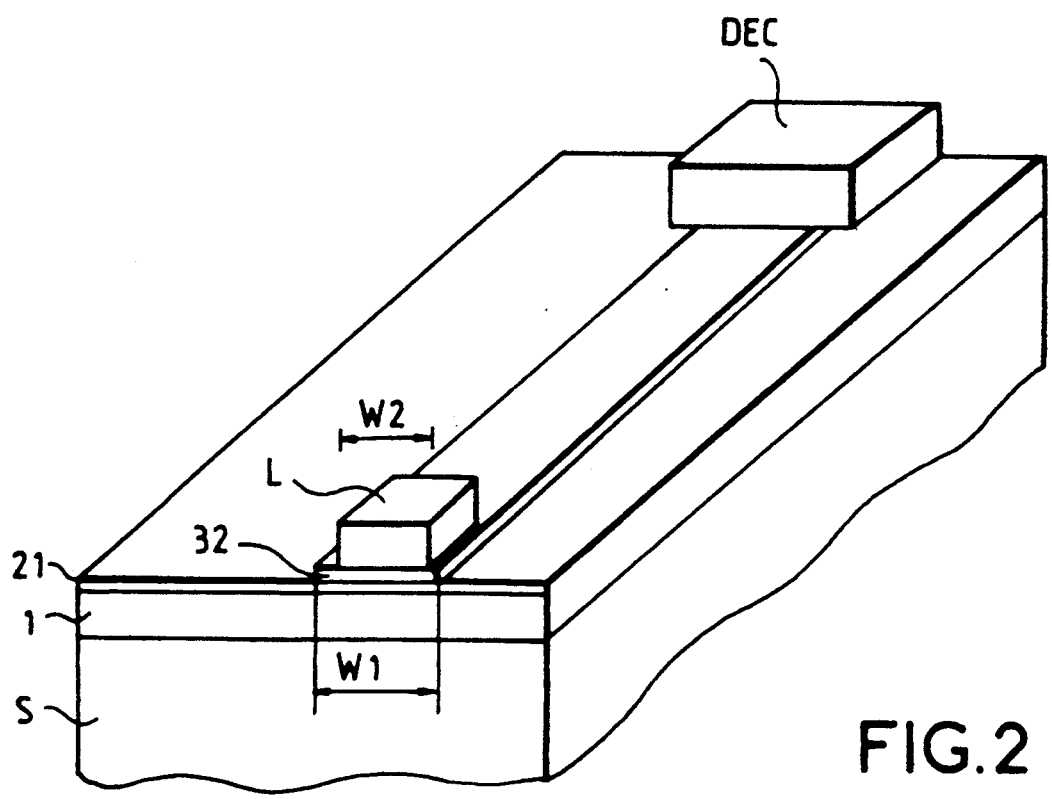

As can be seen in FIG. 2, layer 1 and layer 21 can cover a surface of the substrate S. On the other hand, the guiding element 32 has a limited width W1.

The laser L preferably has a width W2, smaller than width W1. The width of the detector is preferably equal to or greater than W1.

In order to present the basic principle of this device in a more concrete and precise way, three versions of structures which could be used for its manufacture and also three concrete examples of the embodiment will be described.

The first two versions (FIGS. 3 and 4) describe the principle of integration of a distributed feedback (DFB) laser and a photodetector. The third version (FIG. 5) concerns the integration of a Perot-Fabry cavity laser and a photodetector, which may be advantageous in terms of manufacturing costs.

Figure 3:
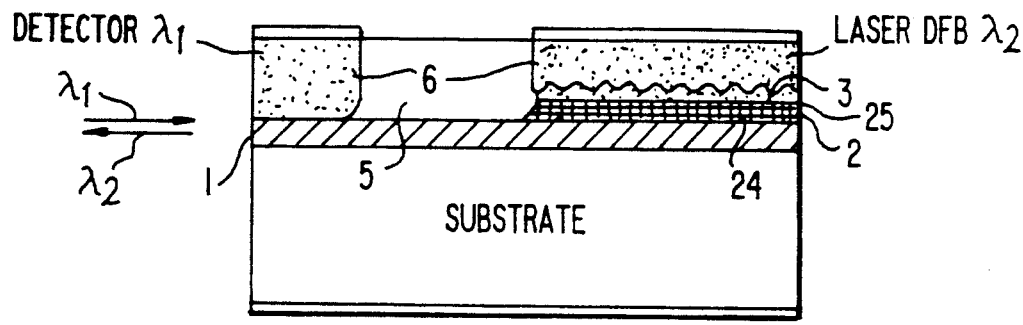
FIGS. 3, 4 and 5 are three detailed examples of the device according to the invention.

With reference to FIG. 3, an example of an embodiment of the invention will now be described in which the laser has a distributed feedback type cavity. The device in FIG. 3 is such that it emits on a wavelength $\lambda_2$ greater than the detected wavelength $\lambda_1$. The structure basically comprises layer 1 serving both as an absorbent (and thus detecting) layer at wavelength $\lambda_1$ and as a transparent (and guiding) layer at wavelength $\lambda_2$. The gap of the material comprising this layer $Eg_{q1}$, is such that $h\lambda_1 > Eg_{q1} > h\lambda_2$.

The DFB laser includes a waveguide formed by the active element layer 2 comprising either a solid material or a set of quantum wells corresponding to the emission wavelength $\lambda_2$, of a layer 3 transparent to $\lambda_2$ and in which the diffraction grid for the distributed feedback will be made. As described previously, a chemically resistant layer 24 is provided between layer 1 and element 2. As will be described later, layer 24 makes it possible to define element 2 and it is therefore used for defining a transversal guiding structure for the laser. According to the invention, a chemically resistant layer 25 can also be provided between layer 3 and layer 2, which facilitates the production of the DFB diffraction grid in layer 3.

All these layers are embedded by a resumption of epitaxy 5 of the material whose gap is greater than that of the material comprising the guiding layers 1 and 3 (for example InP in our application). The p-n type junctions required for producing the laser and the detector are formed either by diffusion, localized epitaxy or any other method.

In this version, the fiber will be placed on the side of the $\lambda_1$ detector.

Figure 4:
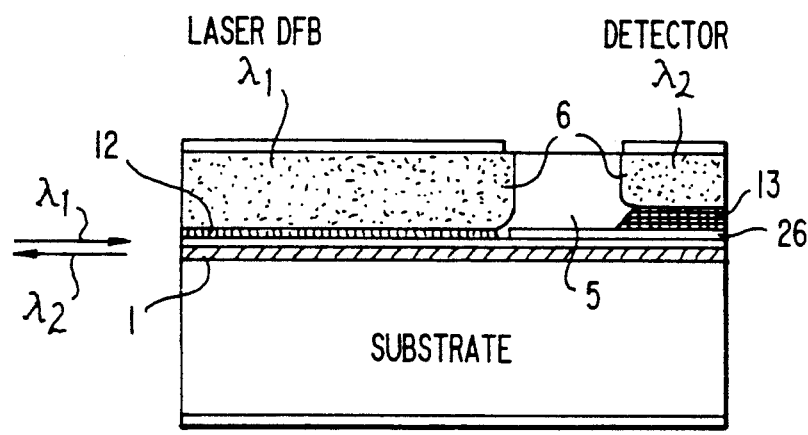

FIG. 4 shows another example of an embodiment of the device according to the invention in which the laser also includes a distributed feedback cavity.

This device complements the device in FIG. 3. It corresponds to the device required at the other end of a fiber (in relation to the preceding one), emitting on a wavelength $\lambda_1$ and detecting on $\lambda_2$. The structure of this device includes a layer 1 adjusted to the emission wavelength $\lambda_1$ and transparent to the detected wavelength $\lambda_2$. A layer 12 made of material transparent to $\lambda_1$ and $\lambda_2$ is used for the production of the diffraction grid in the DFB section emitting at $\lambda_1$. This layer 12 can have the same composition as layer 1.

A layer 13 of material absorbing $\lambda_2$ constitutes the receiver's detector zone. The length of the guiding part located between the DFB laser and the detector must be sufficient to absorb all the light coming from the DFB laser, thus preventing significant crosstalk. Between layer 1 and element 12 a chemically resistant layer 26 is provided. As in the preceding case, after defining a transversal guiding structure, a resumption of epitaxy in material 5 having a guard band greater than that of layers 1, 12 and 13 is carried out in order to embed the complete structure. The p-n junctions 6 required to produce the laser and the detector are formed by diffusion, localized epitaxy or other methods.

The optical fiber is placed on the side of the laser emitting at $\lambda_1$.

Figure 5:
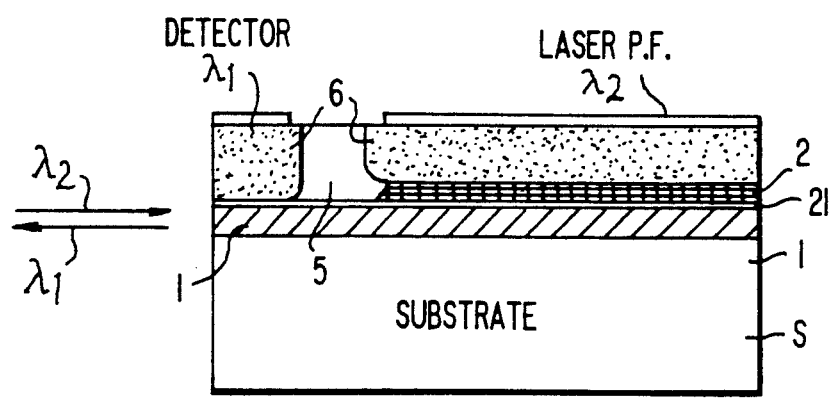

FIG. 5 represents another embodiment in which the laser is a Perot-Fabry laser emitting at wavelength $\lambda_2$ and the receiver detects a wavelength $\lambda_1$ with $\lambda_2 > \lambda_1$.

The structure includes a layer 1 made of material absorbing $\lambda_1$ and transparent to $\lambda_2$, a layer 2 adjusted to the emission wavelength $\lambda_2$ and constituting the laser's gain zone.

As before, a chemically resistant layer 21 is provided on layer 1 for the etching of layer 2. In addition, a transversal guiding structure is provided in layers 1, 21 and 2 then a resumption of epitaxy 5 is carried out in order to embed the structure. The p-n junctions 6 of the detector and the laser are made by diffusion, localized epitaxy or other methods. The Perot-Fabry laser will comprise the cavity formed by the two end faces, including the detecting and guiding parts which are found to be transparent to the emission wavelength $\lambda_2$. In this version, the fiber is placed at the side of detector $\lambda_1$. This structure limited to include only one of the two necessary components for a bi-directional link is advantageous due to its simplicity for obtaining components with low manufacturing costs.

Figure 6:
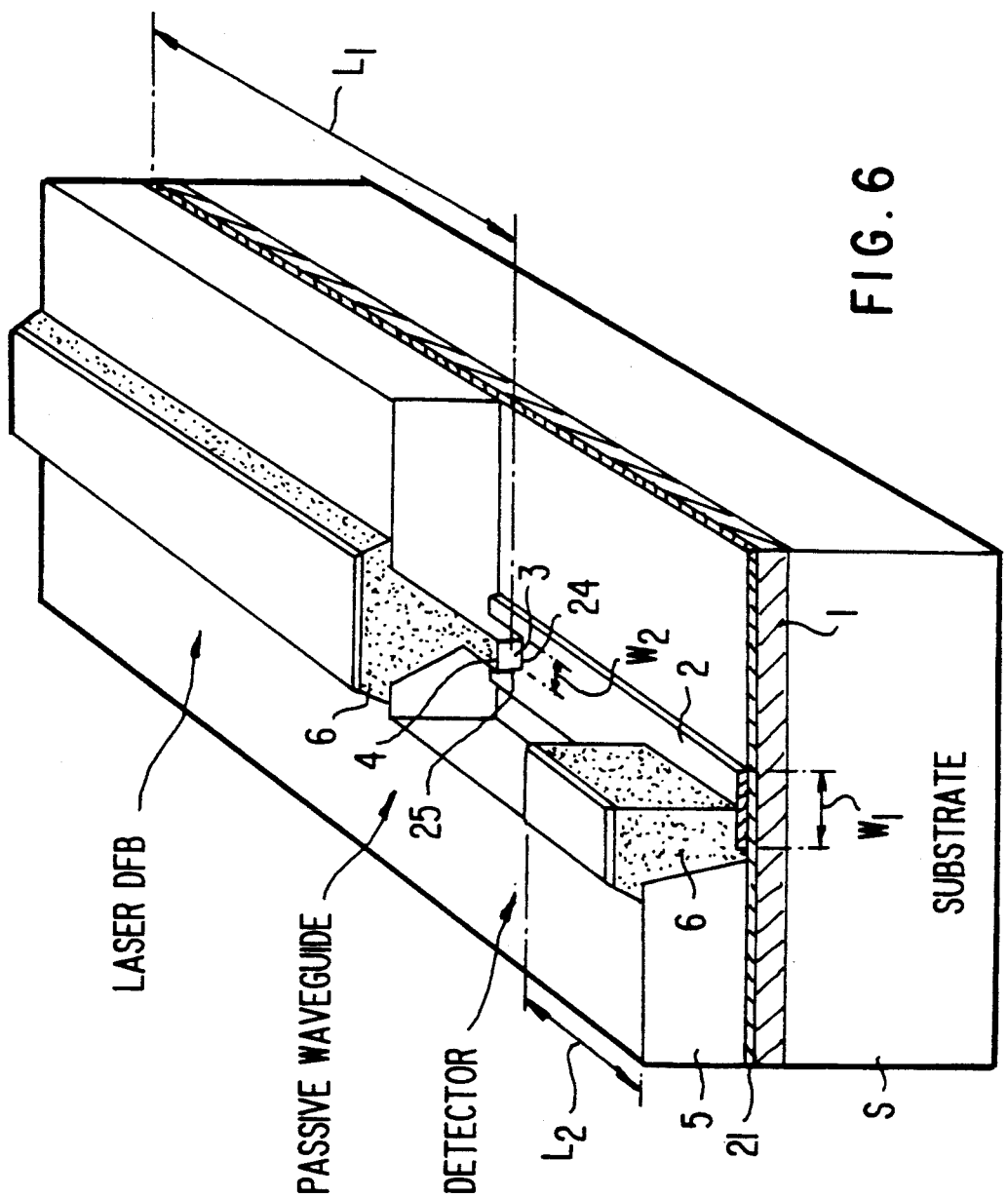
FIGS. 6, 7 and 8 are three simplified examples of the process according to the invention.

With reference to FIG. 6, an example of a manufacturing process according to the invention will now be described.

This process concerns the actual manufacture of the device in FIG. 3 integrating a DBF laser $\lambda_2$ and an embedded type "ribbon" $\lambda_1$ detector. In this example, the p-n junctions are made by a resumption of localized epitaxy on top of the active (detector and emitter) ribbons but can also be made by localized diffusion, which reduces the number of epitaxies.

The technological manufacturing process is as follows:

a first epitaxy on a semiconductor substrate S including at least:

a guiding layer 1 of material transparent to wavelength $\lambda_2$ and absorbing wavelength $\lambda_1$ (for example, quaternal material adjusted to a wavelength of 1.35 $\mu$m for $\lambda_1 = 1.3$ $\mu$m and $\lambda_2 = 1.55$ $\mu$m);

a first chemically resistant layer 21, for example in binary material such as InP;

a second guiding layer 2 used to laterally define the passive waveguide after it has been etched in ribbon form and whose thickness can be a few tens of nanometers. The material constituting this layer must also be transparent to the wavelength $\lambda_2$ (for example GaInAsP adjusted to a wavelength of 1.35 $\mu$m);

a layer 3 comprising material or multiple quantum wells adjusted to the emission wavelength $\lambda_2$ (for example 1.55 $\mu$m). This layer may be separated from layer 2 by a chemically resistant layer 24;

a layer 4 used in the production of the diffraction and transparent to $\lambda_2$ (for example quaternal 1.15 $\mu$m or 1.3 $\mu$m). Layer 4 can also be separated from layer 3 by a chemically resistant layer 25.

After producing a diffraction grid adjusted to $\lambda_2$ in layer 3, a delimitation of the active ribbon of the DFB laser is carried out by chemical etching (or other methods, for example ionic etching, RIE, etc.) through layers 2, 3 and 25 along a length $L_1$ and a width $W_2$ down to layer 24. The ribbon serving as a passive guide is then formed by etching through layer 32 along the whole length of the component and across a width $W_1$ using the same etching methods mentioned previously down to layer 21.

A second epitaxy comprising a layer 5 of material of the same nature as the substrate (for example InP), and if possible of the semi-insulating type so as to ensure adequate electrical insulation between the detector and the emitter, is carried out on the whole structure.

To make a p-n heterojunction on the ribbons of the detector and the laser, there are several possible alternatives. Two cases will be given as an example:

1st CASE: localized diffusion 6 of a doping element (for example Zn for type P) is carried out through a silicon mask down to the detecting layers 2 and laser layer 13.

2nd CASE: after etching a groove in layer 5 localized only on the detecting and emitting zones, a doped layer 6 (for example Zn type P) is formed by epitaxy, then this layer is etched in ribbon form (see FIG. 6) to localize the contact.

As regards the dimensions relative to the layer thicknesses and the guide widths, these must be chosen so as to ensure single mode operation of the structure as well as a good connection with the output optical fiber.

For example, for wavelengths $\lambda_1 = 1.3$ $\mu$m and $\lambda_2 = 1.35$ $\mu$m, the thickness of the quaternary layer $\lambda_1$ (GaInAsP adjusted to 1.35 $\mu$m) is approximately 0.3 $\mu$m, the thickness of layer 32 (in quaternary adjusted to 1.35 $\mu$m) is approximately 25 nm, the width of the ribbon $W_1$ etched in the latter approximately 3 $\mu$m, the thickness of the layer 2 (in quaternary adjusted to around 1.55 $\mu$m) approximately 0.2 $\mu$m, that of layer 3 (adjusted to 1.35 $\mu$m) approximately 0.15 $\mu$m.

The width $W_2$ of the active ribbon etched in these two latter layers is approximately 1 $\mu$m.

Figure 7:
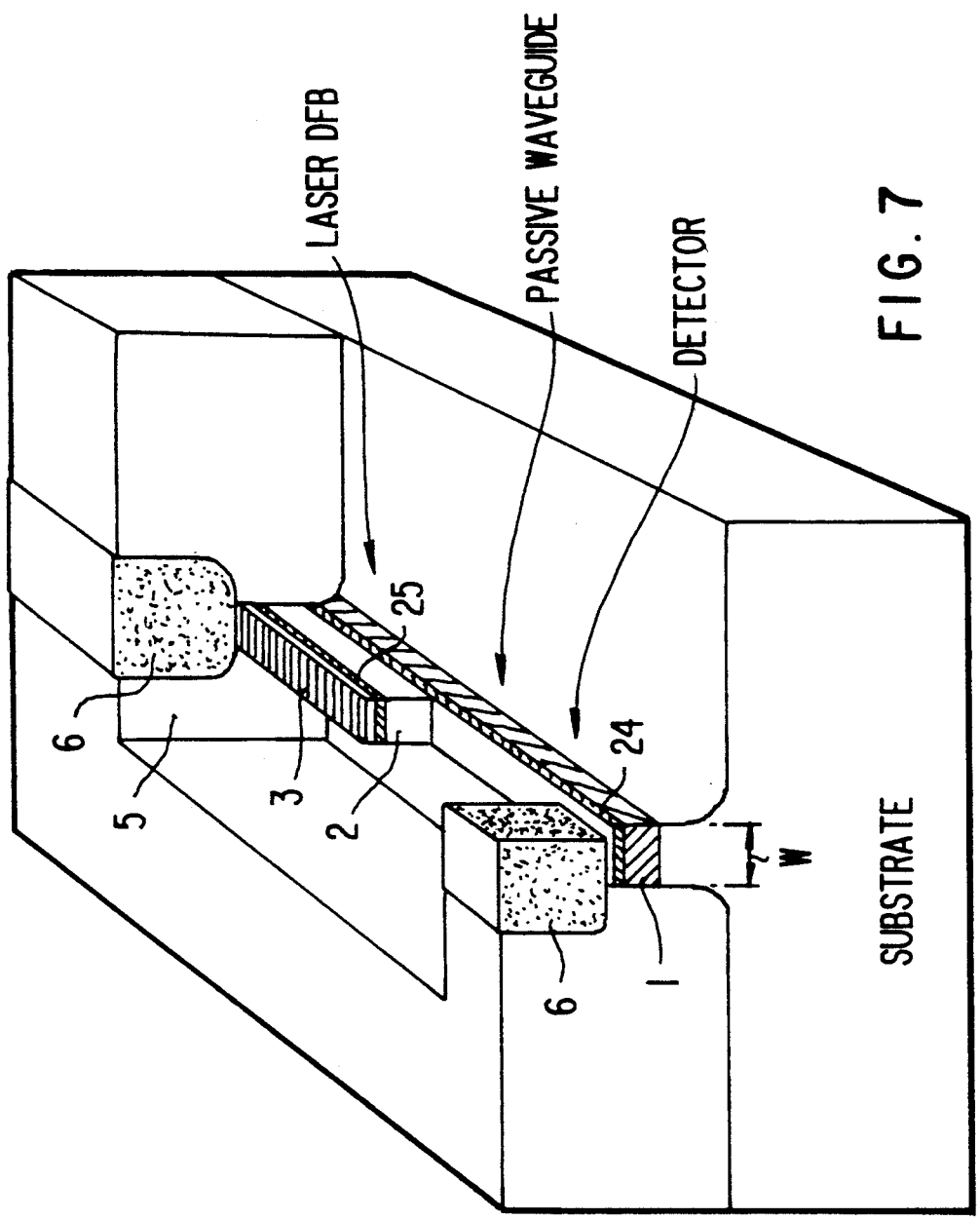

FIG. 7 represents another example of the manufacturing process according to the invention.

The technological process is as follows:

First epitaxy on a substrate of a guiding layer 1 made of material absorbing $\lambda_1$ but transparent to $\lambda_2$ (for example in quaternary adjusted to a wavelength of 1.35 $\mu$m), an active layer 2 for the laser made of material (or quantum wells) adjusted to $\lambda_2$ (for example quaternary adjusted to $\lambda_2 = 1.55$ $\mu$m). This layer can be separated from layer 1 by a chemical etching prevention layer 24, a layer 3 of material transparent to $\lambda_2$ in which the diffraction grid of the DFB laser will be etched (for example a quaternary adjusted to $\lambda = 1.3$ $\mu$m). (In a variant of the embodiment according to the invention facilitating the production of the version in FIG. 5—the Perot-Fabry laser—this layer is not useful because it only serves for the production of the diffraction grid). Layer 3 can be separated from layer 2 by a chemically resistant layer 25.

Production of the DFB grid in layer 3 down to layer 25.

Delimitation of layers 3 and 2 by chemical etching (or other methods) on the zone comprising the laser down to layer 10, then etching of a ribbon of width W on the whole length of the structure (for example $W = 1.5$ $\mu$m).

Resumption of epitaxy of a material 5 transparent to $\lambda_1$ and $\lambda_2$ (for example in InP), and of semi-insulating type if possible in order to ensure adequate electrical insulation between detector and emitter.

Forming a p-n heterojunction either by localized diffusion 6 with a doping element (for example Zn), through a dielectric mask, above the laser and detector zones, either by a localized epitaxy (for example InP type P) after etching a groove in the material 5.

The dimensions of the thicknesses of the layers is the same as before.

Figure 8:
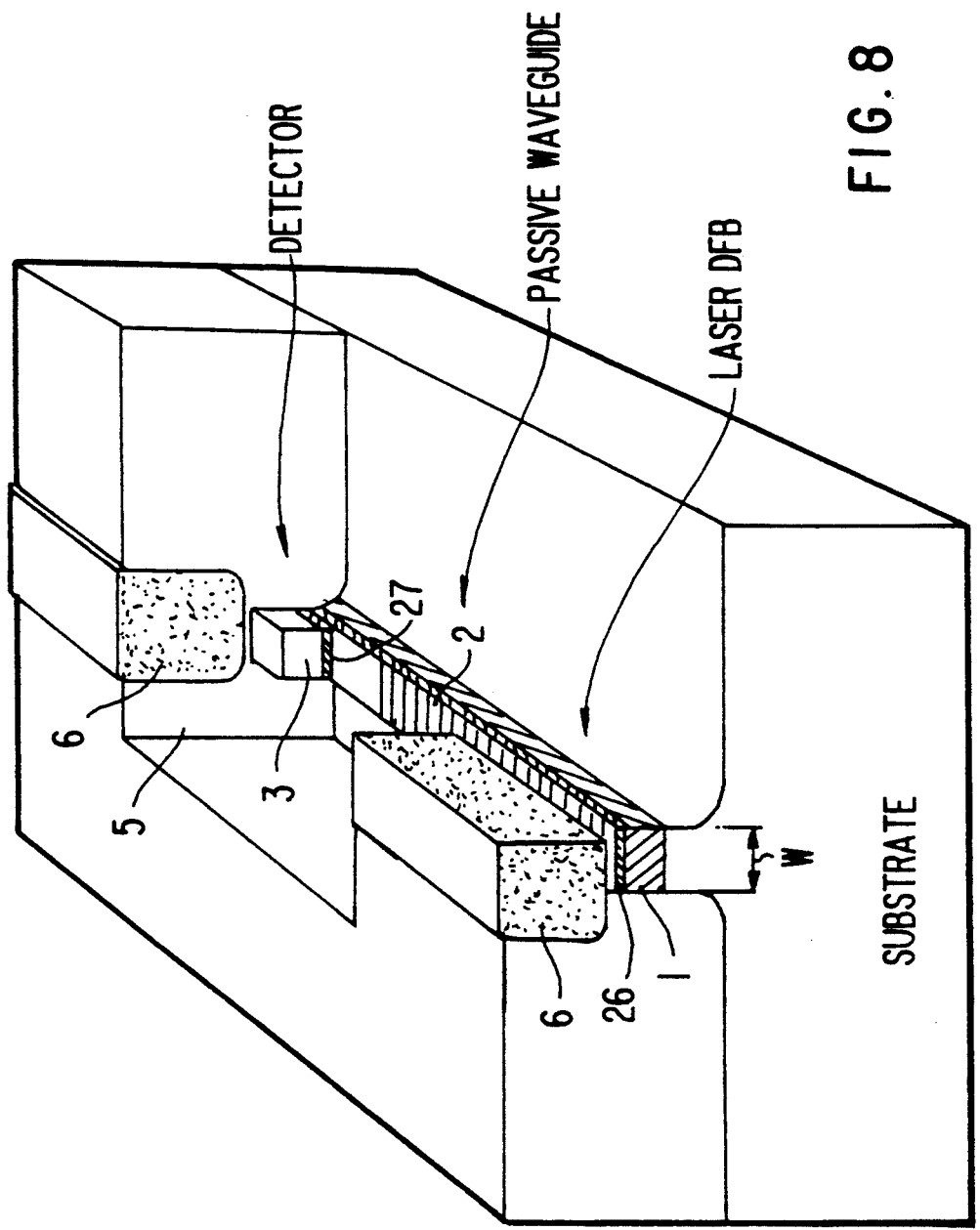

FIG. 8 represents another manufacturing process.

This process concerns the manufacture of a device emitting at $\lambda_1$ and detecting at $\lambda_2$ such as that in FIG. 4.

First epitaxy on a substrate of a guiding layer 1 in material adapted to $\lambda_1$ (for example 1.3 $\mu$m), a second layer 2 in material transparent to $\lambda_1$ and $\lambda_2$ in which will be etched the DFB diffraction grid for example a quarternary adjusted to a wavelength of 1.55 $\mu$m, a third layer 3 in material absorbing $\lambda_2$ for example a quarternary adjusted to a wavelength of 1.15 $\mu$m constituting the receiver's detecting zone. These layers can be separated from each other by chemical etching prevention layers 26 and 27.

After delimitation of the layer 3 by chemical etching (or other methods) in the zone constituting the detector down to layer 27, the diffraction grid is produced in layer 2 and only in the active part of the DFB laser using the chemically resistant layer 26.

Etching of a ribbon of width W on the whole length of the device (for example InP) and if possible of a semi-insulating type to electrically insulate the emitter and the detector, Forming of a p-n heterojunction either by localized diffusion 6 of a type P doping element (for example Zn) above the laser and detector zones or by localized epitaxy of a layer of type P. The passive guide located between the laser and the detector must be long enough to absorb the light coming from the DFB laser ($\lambda_1$) so as to prevent the detector from becoming saturated or generating crosstalk (for example 200 $\mu$m).

The preceding description is given as an example only. Other variants can be envisaged while remaining within the scope of the invention.

In particular, the materials used in the preceding examples are InP/GaInAsp-based materials, but the invention can be extended to other families of materials, in particular of the type III-V, such as GaAs, GaAlAs, GaInAlAs, etc.

Moreover, the different structures described can be used on semi-insulating type substrates facilitating on the one hand better electrical insulation between detector and emitter and on the other hand the integration of other opto-electronic or electronic functions. According to the invention, one of the components (emitter or detector) can also be replaced by other opto-electronic or optical functions such as amplifier, modulator, etc.

We claim:

1. An optical semiconductor transceiver, comprising:
    a substrate;
    a guiding layer for guiding light of a first wavelength and a second wavelength;
    a first chemically resistant layer formed over the guiding layer;
    a guiding element formed over the first chemically resistant layer;
    a detector for detecting light of the first wavelength formed over the guiding element; and
    a laser for emitting light of the second wavelength formed over the guiding element; and
    a second chemically resistant layer formed between the guiding element and the laser.

2. The optical semiconductor transceiver according to claim 1, wherein the guiding element has a first width and the laser has a second width different from the first width.

3. The optical semiconductor transceiver according to claim 2, wherein the first width is greater than the second width.

4. The optical semiconductor transceiver according to claim 1, wherein the guiding element has a first width and the laser has a second width equal to the first width.

5. The optical semiconductor transceiver according to claim 1, wherein the laser comprises a distributed diffraction grid.

6. The optical semiconductor transceiver according to claim 1, wherein the second chemically resistant layer is further formed between the guiding element and the detector.

7. The optical semiconductor transceiver according to claim 1, further comprising an optical containment material formed over the laser and detector.

* * * * *